US012763123B2

(12) United States Patent
Hu et al.

(10) Patent No.: US 12,763,123 B2
(45) Date of Patent: Oct. 13, 2026

(54) COMPUTING CIRCUIT, MEMORY CELL, AND COMPUTE-IN-MEMORY DEVICE

(71) Applicant: Taiwan Semiconductor Manufacturing Company, Ltd., Hsinchu (TW)

(72) Inventors: Chen-Yu Hu, New Taipei City (TW); Ming-Yuan Song, Hsinchu City (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 87 days.

(21) Appl. No.: 18/671,929

(22) Filed: May 22, 2024

(65) Prior Publication Data

US 2025/0364027 A1 Nov. 27, 2025

(51) Int. Cl.
*G11C 11/16* (2006.01)

(52) U.S. Cl.
CPC ...... *G11C 11/1675* (2013.01); *G11C 11/1655* (2013.01); *G11C 11/1657* (2013.01); *G11C 11/1673* (2013.01)

(58) Field of Classification Search
CPC ............ G11C 11/1675; G11C 11/1655; G11C 11/1657; G11C 11/1673
USPC ........................................... 365/189.011, 158
See application file for complete search history.

(56) References Cited

U.S. PATENT DOCUMENTS

2020/0279597 A1* 9/2020 Wang ...................... G11C 11/18
2021/0210127 A1* 7/2021 Drouard .............. G11C 11/1675
2023/0046423 A1* 2/2023 Xing ................... G11C 11/1673

FOREIGN PATENT DOCUMENTS

EP 3945521 A1 * 2/2022 ......... G11C 11/1675

* cited by examiner

*Primary Examiner* — Huan Hoang
(74) *Attorney, Agent, or Firm* — JCIPRNET

(57) ABSTRACT

This disclosure provides a computing circuit. The computing circuit includes a first magnetic tunnel junction and a second magnetic tunnel junction. The first magnetic tunnel junction is configured to store a first logic value based on a write current. The second magnetic tunnel junction is configured to store a second logic value based on the write current. The first logic value is different from the second logic value.

20 Claims, 8 Drawing Sheets

| | B=+1 | B=−1 |
|---|---|---|
| A=+1 | 1 ($R_H$) | 0 ($R_L$) |
| A=−1 | 0 ($R_L$) | 1 ($R_H$) |

| | B=+1 | B=−1 |
|---|---|---|
| A=+1 | 1 ($R_H$) | 0 ($R_L$) |
| A=−1 | 0 ($R_L$) | 1 ($R_H$) |

COMPUTING CIRCUIT, MEMORY CELL, AND COMPUTE-IN-MEMORY DEVICE

BACKGROUND

Compute-in-memory (CIM) is a technology to store information in the main random-access memory (RAM) of computers and to perform calculations at memory cell level, rather than moving large quantities of data between the main RAM and data stored for each computation step. Because stored data is accessed much more quickly when it is stored in RAM, CIM allows data to be analyzed in real time, enabling faster reporting and decision-making in business and machine learning applications.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION

Figure 1:
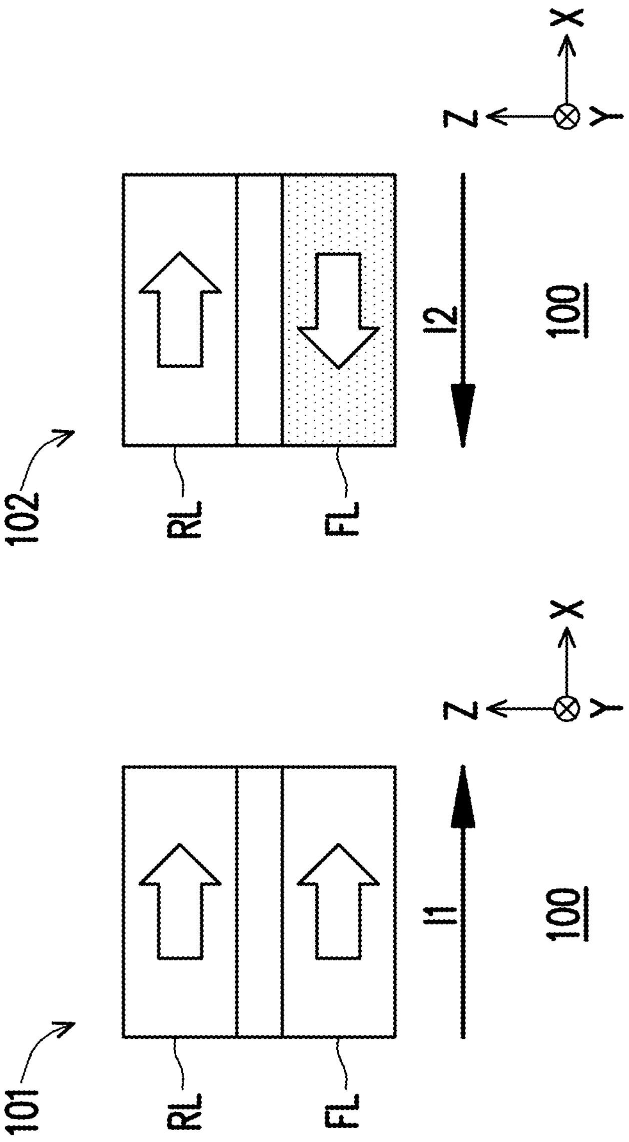
FIG. 1 is a schematic side view of a spin-orbit torque magnetic random-access memory cell according to some embodiments of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

CIM is a technology to store information in the main RAM of computers and to perform calculations at memory cell level, rather than moving large quantities of data between the main RAM and data store for each computation step. Because stored data is accessed much more quickly when it is stored in RAM, CIM allows data to be analyzed in real time, enabling faster reporting and decision-making in business and machine learning applications.

One application of the CIM is artificial intelligence (AI), and specifically machine learning. For example, a computing system (e.g., a CIM system) may use multiple layers of computational nodes, where lower layers perform computations based on results of computations performed by higher layers. In some embodiments, these computations may rely on the computation of dot-products and absolute difference of vectors, typically computed with multiply-accumulate (MAC) operations performed on the parameters (e.g., input data and weights).

It is noteworthy that, XOR/XNOR computation is a key function in an MAC operation for CIM applications. To achieve the XOR/XNOR computation, the consensus is using a low-conductance (high-resistance) non-volatile memory. In this regards, spin-orbit torque (SOT) magnetic random-access memory (MRAM) is one of the best choice due to its flexibility in tuning RA value (10~10000 kΩ). However, using SOT-MRAM technology for XOR/XNOR computation may has challenges of relatively large footprint, relatively large operation power consumption, complex circuit design/operation, or poor scalability for mass-production. Therefore, it is the pursuit of people skilled in the art to provide a low-power, small-footprint approach for XOR/XNOR computation utilizing SOT-MRAM technology.

In this disclosure, a novel structure of a computing circuit utilizing the SOT-MRAM is proposed. Only one shared switching current is required to simultaneously store different logic value in the SOT-MRAM instead of two or more currents. Moreover, smaller footprint is required to accommodate the computing circuit. Further details of the computing circuit will be discussed below with respect to the accompanying drawings.

FIG. 1 is a schematic side view of a SOT-MRAM cell according to some embodiments of the disclosure. With reference to FIG. 1, a SOT-MRAM cell 100 may include a reference layer RL and a free layer FL. Further, a thin dielectric layer may be disposed between the reference layer RL and the free layer FL while the reference layer RL is disposed above the free layer FL in a Z direction. However, this disclosure is not limited thereto. It is noted that, a magnetic polarity of the reference layer RL is fixed and a magnetic polarity of the free layer FL may change based on a SOT field (e.g., induced by a current) to store a logic value (e.g., "0" or "1") in the SOT-MRAM cell 100. In other words, the magnetic polarity of the reference layer RL is fixed regardless of the current direction. Therefore, the SOT-MRAM cell 100 may be also referred to as a magnetic tunnel junction (MTJ). In one embodiment, while a direction of a current is along a X direction and two SOT-MRAM cells 100 are both disposed along a Y direction, the two SOT-MRAM cells 100 may be referred to as "type-Y configuration".

Reference is now made to the left half of the FIG. 1. In a scenario 101, a current I1 may flow through, or next to, the SOT-MRAM cell 100 from left to right along a X direction. The current I1 may create a spin-orbit torque, which exerts a torque on the free layer FL and the torque may switch a magnetic polarity of the free layer FL, either from left to right, or vice versa. For example, in the scenario 101, the magnetic polarity of the free layer FL may be designed to have a same direction as the current I1. However, this disclosure is not limited thereto. That is, since the current I1 flows from left to right, the magnetic polarity of the free layer FL may be right as well.

Reference is now made to the right half of the FIG. 1. In a scenario 102, a current I2 may flow through, or next to, the SOT-MRAM cell 100 from right to left along the X direction. The current I2 may create a spin-orbit torque, which exerts a torque on the free layer FL and the torque may switch a magnetic polarity of the free layer FL, either from left to right, or vice versa. For example, in the scenario 102, the magnetic polarity of the free layer FL may be designed to have a same direction as the current I2. However, this disclosure is not limited thereto. That is, since the current I2 flows from right to left, the magnetic polarity of the free layer FL may be left as well.

It is worth mentioned that, traditionally, when two or more SOT-MRAM cells 100 are electrically coupled in serial, a current pass through the two or more SOT-MRAM cells 100 may lead to a result that all the magnetic polarities are in one same direction. That is, these SOT-MRAM cells 100 may not be able to store different values utilizing only one current. On the other hand, when these SOT-MRAM cells 100 are electrically coupled in parallel, by applying one current to each of these SOT-MRAM cells 100, these SOT-MRAM cells 100 may be able to store different values. However, since more than one current is used, the overall power consumption may be increased.

Figure 2A:
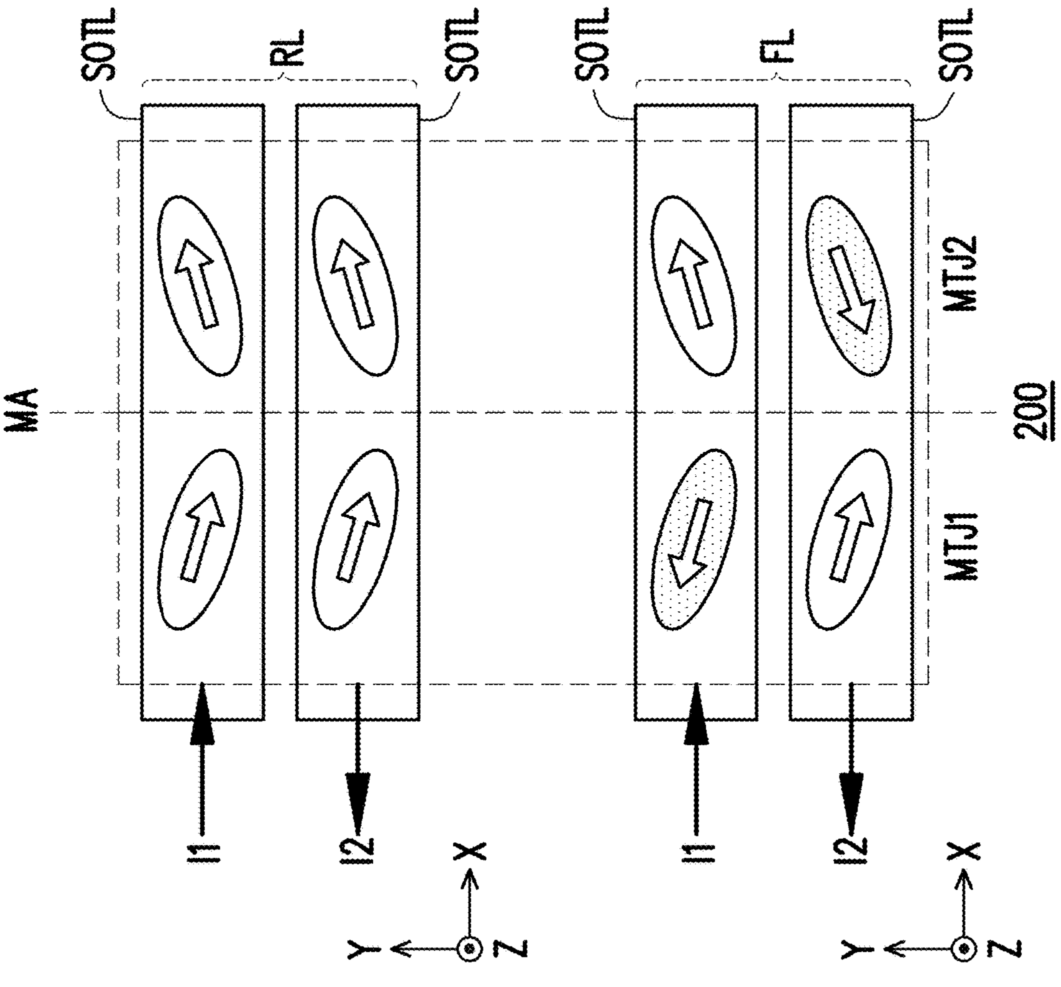
FIG. 2A is a schematic top view of a computing circuit according to a first embodiment of the disclosure.
Figure 2C:
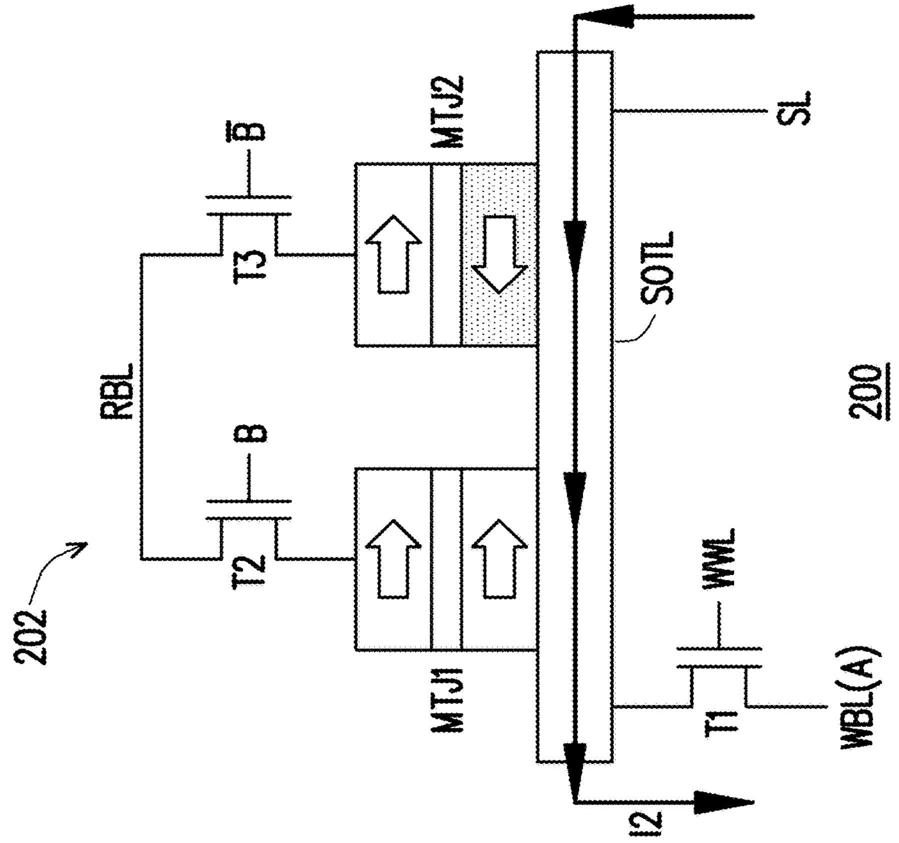
FIG. 2B and FIG. 2C are schematic diagrams of a computing circuit according to a first embodiment of the disclosure.
Figure 2B:
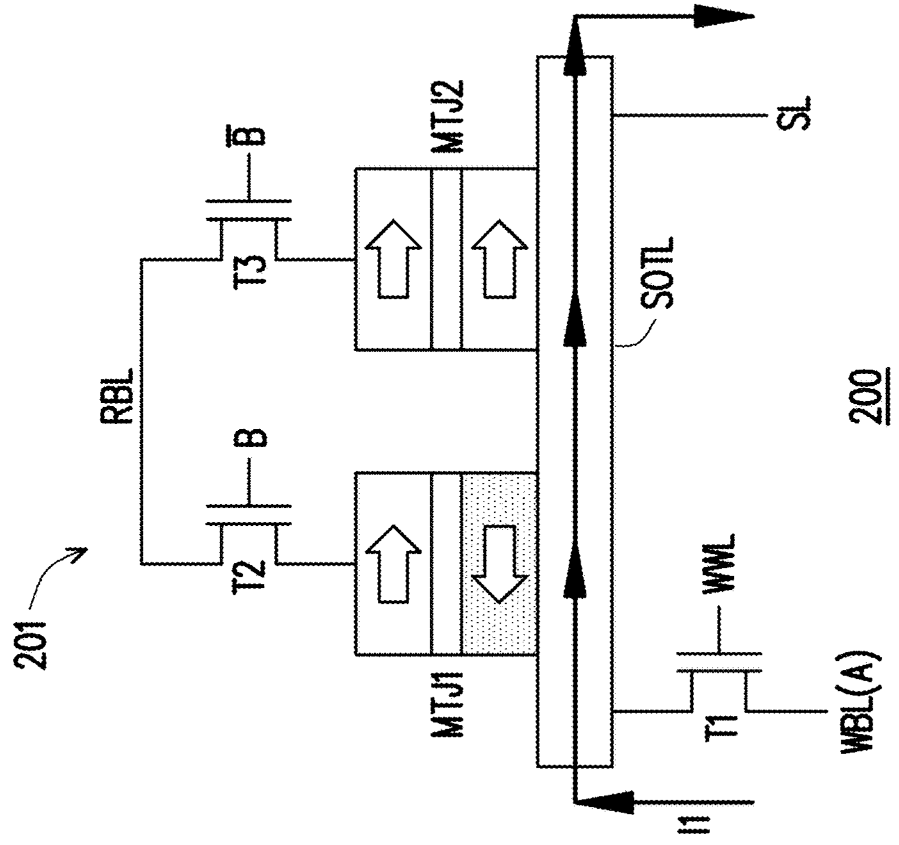

FIG. 2A is a schematic top view of a computing circuit according to a first embodiment of the disclosure. FIG. 2B and FIG. 2C are schematic diagrams of a computing circuit according to a first embodiment of the disclosure.

Reference is first made to FIG. 2A. A computing circuit 200 may include two SOT-MRAM cells 100, such as a first MTJ MTJ1 and a second MTJ MTJ2. The first MTJ MTJ1 and the second MTJ MTJ2 may be disposed on or electrically coupled to a SOT line SOTL (also referred to as a SOT track), and the first MTJ MTJ1 may be electrically coupled to the second MTJ MTJ2 in serial. Each of the first MTJ MTJ1 and the second MTJ MTJ2 may include the reference layer RL and the free layer FL. FIG. 2A has been simplified for the sake of clarity to better understand the inventive concepts of the present disclosure. Additional features will be discussed below with respect to FIG. 2B and FIG. 2C, but this disclosure is not limited thereto. It is noted that, the first MTJ MTJ1 and the second MTJ MTJ2 are not arranged in parallel (i.e., forming a 180-degree angle), but are slightly tilted with respect to each other (i.e., forming an angle that deviates from 180 degrees). That is, the first MTJ MTJ1 and the second MTJ MTJ2 are not parallel to each other or not parallel to the SOT line SOTL. In one embodiment, a first disposing angle of the first MTJ MTJ1 is different from a second disposing angle of the second MTJ MTJ2.

In one embodiment, the second MTJ MTJ2 may be disposed as a mirror image of the first MTJ MTJ1 across a mirror axis MA. For example, a direction of the magnetic polarity of the first MTJ MTJ1 and a direction of a write current may form a first angle smaller than 90 degrees facing a negative X direction. A direction of the magnetic polarity of the second MTJ MTJ2 and a direction of a write current may form a second angle smaller than 90 degrees facing a positive X direction. The first angle and the second angle may be the first disposing angle and the second disposing angle, while the value of the first disposing angle and the second disposing angle may be determined according to design needs. In one embodiment, the first MTJ MTJ1 and the second MTJ MTJ2 may be disposed along directions between a X direction and a Y direction. Further, the first MTJ MTJ1 and the second MTJ MTJ2 may be disposed with respect to the X direction at a positive angle and at a negative angle, respectively. That is, the positive angle and the negative angle are opposite angles relative to the X direction, so that the magnetic polaraties generated by the first MTJ MTJ1 and the second MTJ MTJ2 exhibit a complementary effect. Therefore, while the first MTJ MTJ1 and the second MTJ MTJ2 are under such configuration, the computing circuit 200 may be referred to as "complementary type-XY configuration".

Reference is now made to upper half of FIG. 2A. As the description in connection with FIG. 1, the magnetic polarity of the reference layers RL of the first MTJ MTJ1 and the second MTJ MTJ2 are fixed, no matter how a direction of a current flow through, or next to, the first MTJ MTJ1 and the second MTJ MTJ2 changes. That is, neither the first current I1 flowing to the right nor the second current I2 flowing to the left will cause any change in (a direction of) the magnetic polarity of the reference layer RL.

Reference is now made to lower half of FIG. 2A. Likewise, a magnetic polarity of the free layer FL of the first MTJ MTJ1 and the second MTJ MTJ2 may change based on a SOT field induced by a write current to store a first logic value (e.g., "0") or a second logic value (e.g., "1") in the first MTJ MTJ1 or the second MTJ MTJ2. For example, the first current I1 flowing to the right may switch the free layer FL of the first MTJ MTJ1 to the left and may switch the free layer FL of the second MTJ MTJ2 to the right. On the other hand, the second current I2 flowing to the left may switch the free layer FL of the first MTJ MTJ1 to the right and may switch the free layer FL of the second MTJ MTJ2 to the left. That is, a first magnetic polarity of the first MTJ MTJ1 caused by the write current (e.g., the first current I1 or the second current I2) is different from a second magnetic polarity of the second MTJ MTJ2 caused by the write current. In other words, the first MTJ MTJ1 may be configured to store a first logic value based on a write current and the second MTJ MTJ2 may be configured to store a second logic value based on the write current. The first logic value is different from the second logic value.

It is noted, because the first MTJ MTJ1 or the second MTJ MTJ2 are slighted tilted with respect to each other, by applying one current to both the MTJ MTJ1 or the second MTJ MTJ2, opposite magnetics polarities may be realized through a shared switching current and two difference values may be stored in the first MTJ MTJ1 or the second MTJ MTJ2 at the same time. Therefore, it is possible to bring the SOT-MRAM technology into more diverse applications.

In FIG. 2B and FIG. 2C, the computing circuit 200 may further include a first transistor T1 (also referred to as a write transistor), a second transistor T2 (also referred to as a first read transistor), and a third transistor T3 (also referred to as a second read transistor). The first transistor T1, the second transistor T2, and the third transistor T3 may be respectively electrically coupled to the SOT line SOTL. It is noteworthy that, for the sake of convenience in explanation, FIG. 2B and FIG. 2C have been depicted that the reference layers RL and the free layers FL of the first MTJ MTJ1 and the second MTJ MTJ2 are next to each other and are on a same plane as the first transistor T1, the second transistor T2, and the third transistor T3, but the reference layers RL may be actually disposed above the free layers FL in a direction of height (e.g., Z direction).

In one embodiment, a first end of the second transistor T2 and a first end of the third transistor T3 may be electrically coupled to a read bit line RBL. A control end (e.g., gate terminal) of the second transistor T2 may be configured to receive an input signal B (also referred to as a second input signal) and a control end of the second transistor T2 may be configured to receive an input signal B. A second end of the second transistor T2 may be electrically coupled to a first end of the first MTJ MTJ1. A second end of the third transistor T3 may be electrically coupled to a first end of the second MTJ MTJ2. A second end of the first MTJ MTJ1 and a second end of the second MTJ MTJ2 may be electrically coupled to the SOT line SOTL. A source line SL may be electrically coupled to the SOT line SOTL. A first end of the first transistor T1 may be electrically to the SOT line SOTL. A control end of the first transistor T1 may be electrically coupled to a write word line WWL. A second end of the first transistor T1 may be electrically coupled to a write bit line WBL and may be configured to receive an input signal A (also referred to as a first input signal). That is, the input signal A may be a write current pass through the write bit line WBL. The input signal B may be a gate voltage of a read transistor (e.g. the transistor T2) coupled to a MTJ received from a first read word line RWL1. The input signal $\overline{B}$ may be a gate voltage of a read transistor (e.g. the transistor T3) coupled to a MTJ received from a second read word line RWL2. In addition, a direction of a current that flows through the SOT line SOTL may be determined based on a voltage difference between the write bit line WBL and the source line SL, but this disclosure is not limited thereto.

In FIG. 2B and FIG. 2C, a scenario 201 shows that the first current I1 flows from the write word line WBL to the source line SL and a scenario 202 shows that the second current I2 flows from the source line SL to the write word line WBL. As the discussion in connection with FIG. 2A, the first current I1 flowing to the right may switch the free layer FL of the first MTJ MTJ1 to the left and may switch the free layer FL of the second MTJ MTJ2 to the right and the second current I2 flowing to the left may switch the free layer FL of the first MTJ MTJ1 to the right and may switch the free layer FL of the second MTJ MTJ2 to the left. Therefore, complementary values may be stored in the first MTJ MTJ1 or the second MTJ MTJ2 utilizing only one same current.

Figure 3:
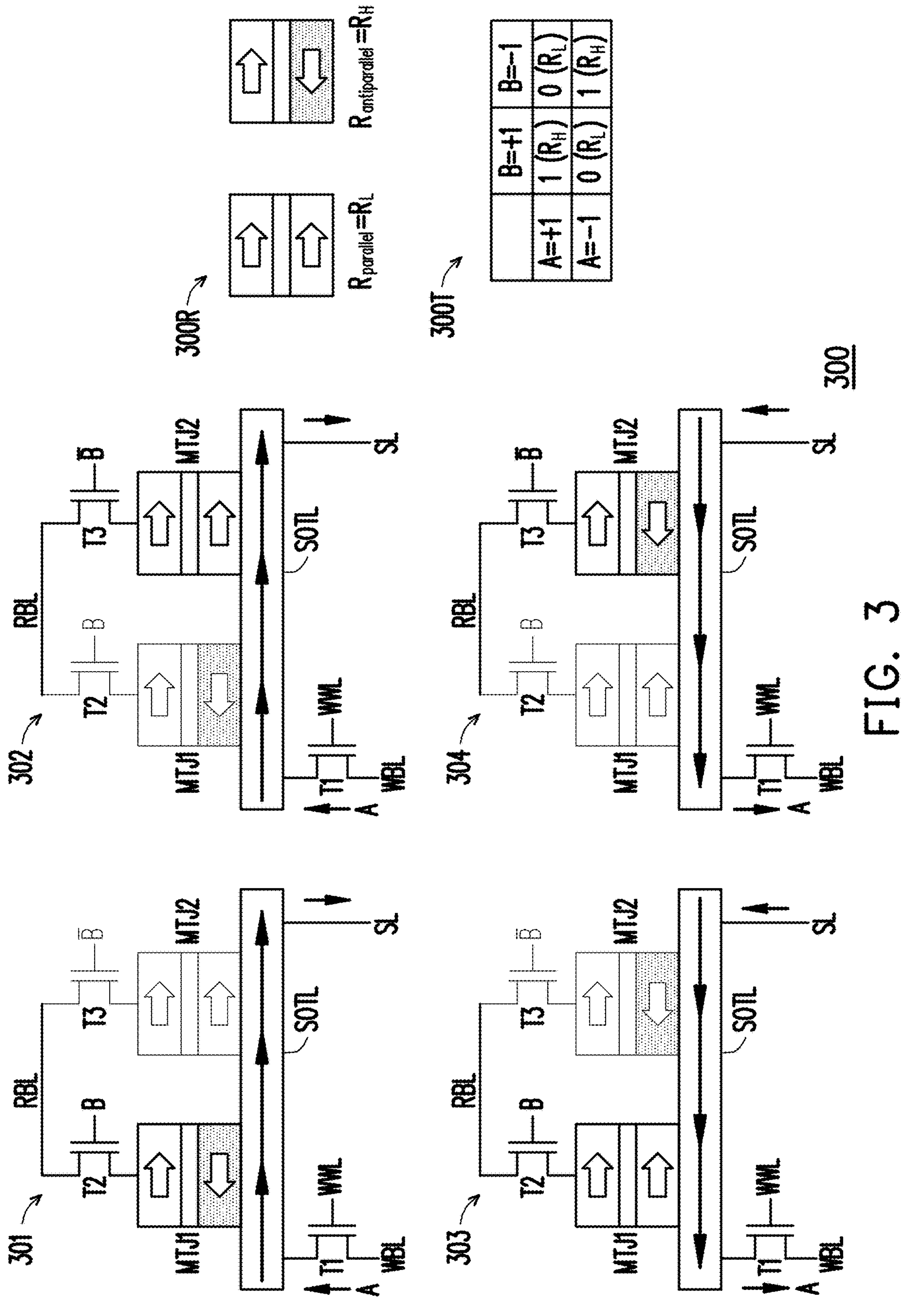
FIG. 3 is a schematic diagram of operations of a computing circuit according to a first embodiment of the disclosure.

FIG. 3 is a schematic diagram of operations of a computing circuit according to a first embodiment of the disclosure. To be more specific, FIG. 3 show how an XNOR calculation may be realized utilizing the computing circuit 200. In one embodiment, a resistance definition 300R shows that while a magnetic polarity of the reference layer RL of a MTJ is parallel or antiparallel to a magnetic polarity of the free layer FL of the MTJ, the MTJ may be represented as a low resistance ($R_L$) or a high resistance ($R_H$) respectively. In one embodiment, the low resistance may be defined as "0" and the high resistance may be defined as "1". In addition, a value of the input signal A (e.g., "+1" or "−1") may represent a direction of a write current pass through the write bit line WBL and a value of the input signal B may represent a gate voltage of a read transistor (e.g., the transistor T2 or the transistor T3) coupled to a MTJ. However, this disclosure is not limited thereto.

In addition, a truth table 300T shows a relationship between the input (e.g., the input signal A and the input signal B) and output (e.g., an output signal at the read bit line RBL) of the computing circuit 200. In one embodiment, as shown in the truth table 300T, the computing circuit 200 may be configured to perform a XNOR calculation of the input signal A (e.g., the write current) and the input signal B (e.g., the gate voltage). It is noted that, although the truth table 300T shown in FIG. 3 is a XNOR table, the computing circuit 200 may be also configured to perform a XOR calculation of the input signal A and the input signal B. For example, the signal to the gate of the second transistor T2 (i.e., input signal B) and the signal to the gate of the third transistor T3 (i.e., reverse input signal B bar) may be swapped or the output definition may be changed from high read resistance ($R_H$)=1 to high read current ($R_L$)=1. However, this disclosure is not limited thereto. For the sake of convenience in explanation, the computing circuit 200 will be explained as performing the XNOR calculation in the following description, but is not limited thereto.

In a scenario 301, while the input signal A and the input signal B are both "+1", a write current passes through the first MTJ MTJ1 and the second MTJ MTJ2 may lead to a result that the first MTJ MTJ1 is in a state of high resistance (i.e., "1") and the second MTJ MTJ2 is in a state of low resistance (i.e., "0"). Further, the second transistor T2 is turned on and the third transistor T3 is turned off and an output signal of "1" may be outputted to the read bit line RBL through the second transistor T2.

In a scenario 302, while the input signal A is "+1" and the input signal B is "−1", a write current passes through the first MTJ MTJ1 and the second MTJ MTJ2 may lead to a result that the first MTJ MTJ1 is in a state of high resistance (i.e., "1") and the second MTJ MTJ2 is in a state of low resistance (i.e., "0"). Further, the second transistor T2 is turned off and the third transistor T3 is turned on and an output signal of "0" may be outputted to the read bit line RBL through the third transistor T3.

In a scenario 303, while the input signal A is "−1" and the input signal B is "+1", a write current passes through the first MTJ MTJ1 and the second MTJ MTJ2 may lead to a result that the first MTJ MTJ1 is in a state of low resistance (i.e., "0") and the second MTJ MTJ2 is in a state of high resistance (i.e., "1"). Further, the second transistor T2 is turned on and the third transistor T3 is turned off and an output signal of "0" may be outputted to the read bit line RBL through the second transistor T2.

In a scenario 304, while the input signal A and the input signal B are both "−1", a write current passes through the first MTJ MTJ1 and the second MTJ MTJ2 may lead to a result that the first MTJ MTJ1 is in a state of low resistance (i.e., "0") and the second MTJ MTJ2 is in a state of high resistance (i.e., "1"). Further, the second transistor T2 is turned off and the third transistor T3 is turned on and an output signal of "1" may be outputted to the read bit line RBL through the third transistor T3.

In this manner, the write bit line may carry the input signal A, which is to write the first MTJ MTJ1 and the second MTJ MTJ2 on the SOT line SOTL and the first MTJ MTJ1 and the second MTJ MTJ2 may be operated into complementary states (e.g., $R_H$ and $R_L$). Further, gates of read transistors coupled to the MTJs may represent the input signal B of an encryption key, determining which MTJ will be accessed. Furthermore, the output may be determined by the state of an accessed MTJ, while a high resistance state or a low resistance state of the accessed MTJ stands for a "1" or a "0". That is, the data storage and encryption may be done simultaneously and a XOR/XNOR calculation may be realized by the computing circuit 200.

It is worth mentioned that, at the stage of fabrication, magnetization directions of the first MTJ MTJ1 and the second MTJ MTJ2 may face a same direction, instead of facing opposite directions. That is, the computing circuit 200 is fabrication friendly in aligning magnetization directions of the free layers FL and the reference layers RL. Further, at the stage of operation, the write current may directly apply to the computing circuit 200 instead of performing an initialization first to initialize the state of the free layers FL. That is, the computing circuit 200 is initialization-free, which is beneficial for a faster operation speed and lower operation power. Furthermore, the energy barrier of the first MTJ MTJ1 and the second MTJ MTJ2 remain the same instead of being smaller due activated barrier. That is, the write error rate (WER) does not increase and remains at a low level. Moreover, for the write operation, only one shared switching current is used to change the states of the first MTJ MTJ1 and the second MTJ MTJ2 instead of two or more currents. That is, the computing circuit 200 may bring improvements in the power consumption during the write operation. In addition, for the read operation, only one read transistor needs to be turned on instead of turning on two transistors. That is, the computing circuit 200 may bring improvements in the power consumption during the read operation.

Figure 4:
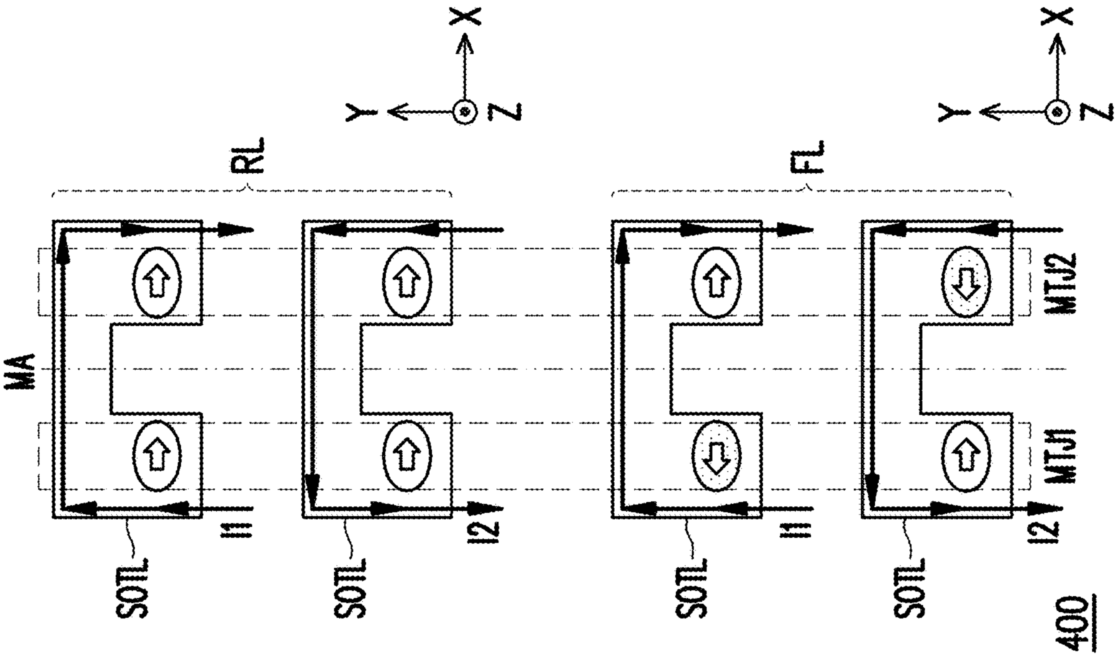
FIG. 4 is a schematic top view of a computing circuit according to a second embodiment of the disclosure.

FIG. 4 is a schematic top view of a computing circuit according to a second embodiment of the disclosure. With reference to FIG. 4, a computing circuit 400 a first MTJ MTJ1 and a second MTJ MTJ2. FIG. 4 has been simplified for the sake of clarity to better understand the inventive concepts of the present disclosure. Additional features of the computing circuit 400 may be seen with reference to the computing circuit 200 shown in FIG. 2B and FIG. 2C, while the details are not redundantly described seriatim herein.

In FIG. 4, like FIG. 2A, a current I1 or a current I2 may flow through, or next to, the first MTJ MTJ1 and the second MTJ MTJ2 along opposite directions. Further, magnetic polarities of the reference layers RL of the first MTJ MTJ1 and the second MTJ MTJ2 are fixed and magnetic polarities of the free layers FL of the first MTJ MTJ1 and the second MTJ MTJ2 may be changed based on the first current I1 or the second current I2. Different from FIG. 2, the first MTJ MTJ1 and the second MTJ MTJ2 are arranged in parallel, which is referred to the "type-Y configuration" Further, the SOT line SOTL may have a shape of "U" instead being a straight line. The first MTJ MTJ1 and the second MTJ MTJ2 may be respectively disposed on two protruding parts of the SOT line SOTL and a channel part of the SOT line SOTL may be disposed between the two protruding parts. In one embodiment, the second MTJ MTJ2 may be disposed as a mirror image of the first MTJ MTJ1 across a mirror axis MA.

It is noteworthy that, due to the shape of the SOT line SOTL of the computing circuit 400, a write current may undergo a change in direction as the write current flows through the SOT line SOTL. For example, a first current direction of the write current flowing in the SOT line SOTL of the first MTJ MTJ1 may be different from a second current direction of the write current flowing in in the SOT line SOTL of the second MTJ MTJ2. As a result, the first current I1 may switch the free layer FL of the first MTJ MTJ1 to an upward direction in the Y direction and may switch the free layer FL of the second MTJ MTJ2 to a downward direction in the Y direction. Similarly, the first current I2 may switch the free layer FL of the first MTJ MTJ1 to the downward and may switch the free layer FL of the second MTJ MTJ2 to the upward direction. In this manner, opposite magnetics polarities may be realized through a shared switching current and two difference values may be stored in the first MTJ MTJ1 or the second MTJ MTJ2 at the same time. Therefore, it is possible to bring the SOT-MRAM technology into more diverse applications.

Figure 5:
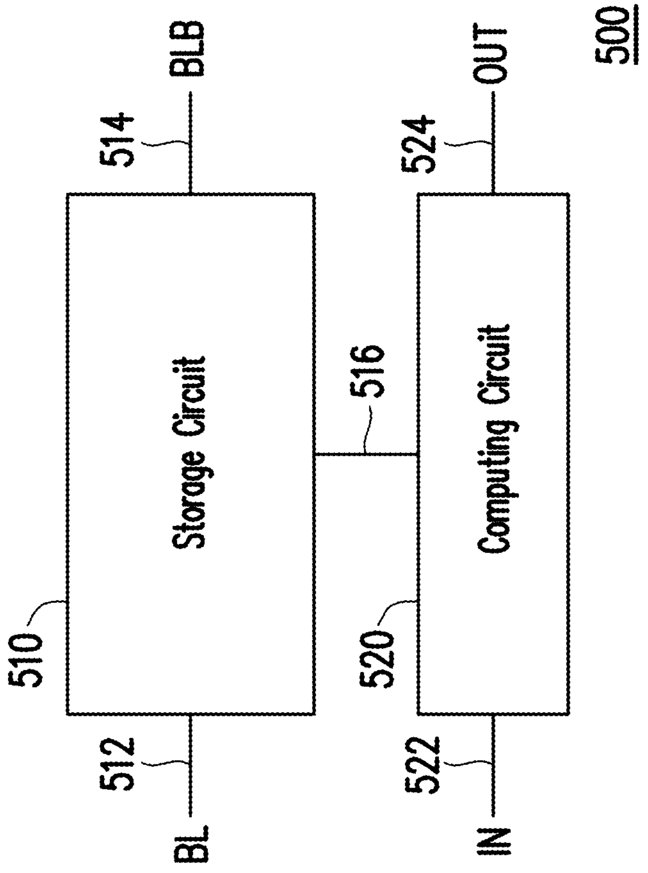
FIG. 5 is a schematic diagram of a memory cell according to some embodiments of the disclosure.

FIG. 5 is a schematic diagram of a memory cell according to some embodiments of the disclosure. With reference to FIG. 5, a memory cell 500 may include a storage circuit 510 and a computing circuit 520. The storage circuit 510 may be electrically coupled to the computing circuit 520 and configured to store data. The computing circuit 520 may be configured to perform a calculation based on the data. In one embodiment, the computing circuit 520 may include at least one of the computing circuit 200 and the computing circuit 400, but this disclosure is not limited thereto. In one embodiment, the computing circuit 520 may include SOT-MRAM cells 100 (e.g., the first MTJ MTJ1 and the second MTJ MTJ2) for realizing a computation (e.g., XOR/XNOR computation). Further, the storage circuit 510 may also include SOT-MRAM cells 100 for storing data. That is, the storage circuit 510 and the computing circuit 520 may utilize a same kind of memory. In another, the storage circuit 510 may utilize a different kind of memory. For example, the storage circuit 510 may utilize NAND flash memory, NOR flash memory, Static Random Access Memory (SRAM), Dynamic Random Access Memory (DRAM), Phase Change Memory (PCM), Resistive Random Access Memory (ReRAM), 3D XPoint memory, ferroelectric random-access memory (FeRAM), and other types of memories.

In one embodiment a first end 512 of storage circuit 510 may be electrically coupled to a bit line BL and a second end 514 of storage circuit 510 may be electrically coupled to a bit line BLB. Further, the storage circuit 510 may be electrically coupled to word lines (not shown). The storage circuit 510 may be configured to store data and provide the data to the computing circuit 520 by a communication path 516.

The computing circuit 520 may be configured to perform computations, such as computations in CIM operations. A first end 522 of the computing circuit 520 may be configured to receive an input signal IN. The computing circuit 520 may be configured to perform the computations based on the data (e.g., weight) from the storage circuit 510 and the input signal IN. A second end 524 of the computing circuit 520 may be configured to provide a computation result.

It is worth mentioned that, in another embodiment, the storage function of storage circuit 510 and the computing function of the computing circuit 520 may be realized merely by the computing circuit 200 or the computing circuit 400. That is, without the help of an additional memory, the computing circuit 200 or the computing circuit 400 may serve as both a memory and a circuit for in-memory computation. However, this disclosure is not limited thereto.

Figure 6:
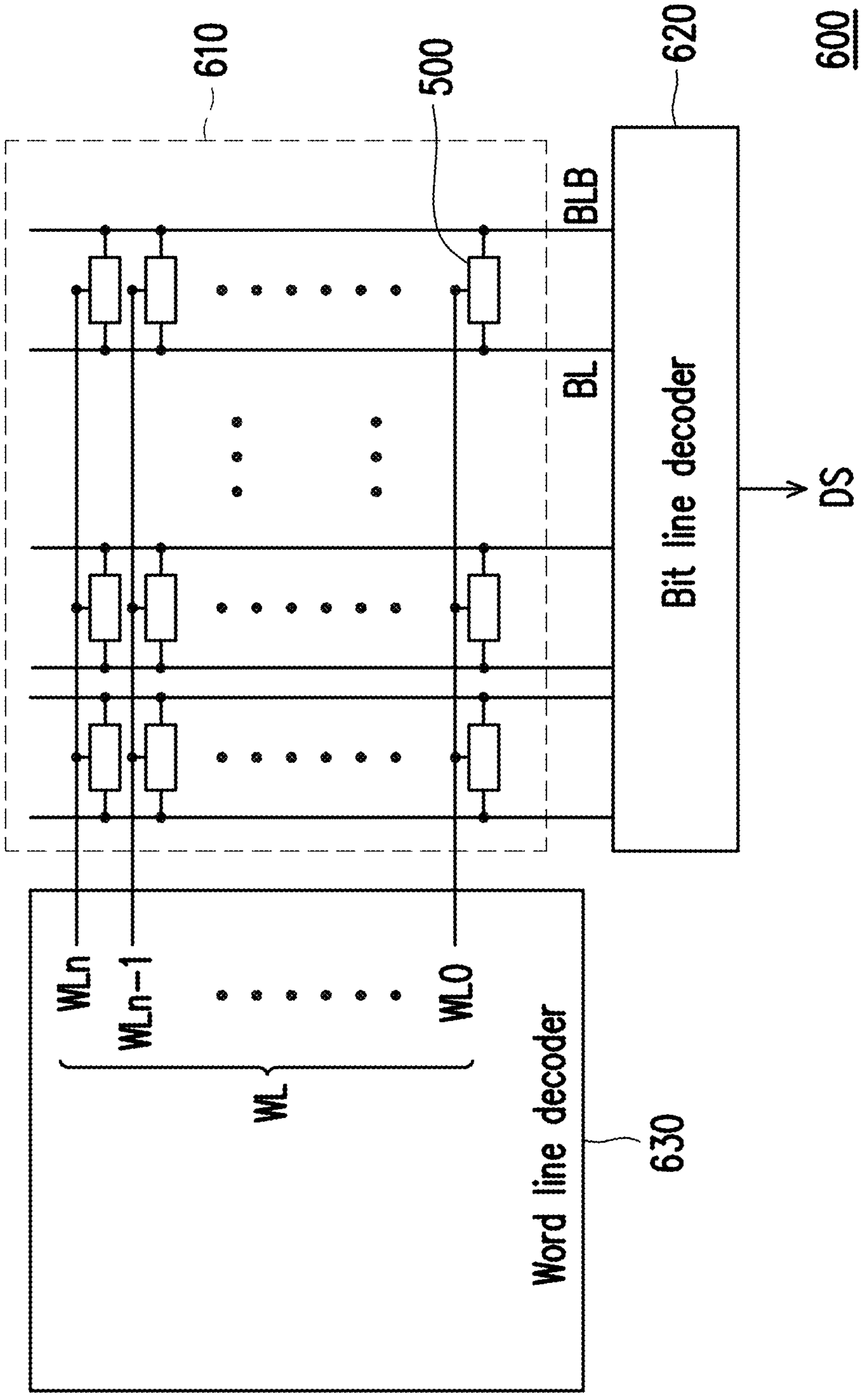
FIG. 6 is a schematic diagram of a compute-in-memory device according to some embodiments of the disclosure.

FIG. 6 is a schematic diagram of a compute-in-memory device according to some embodiments of the disclosure. With reference to FIG. 6, a compute-in-memory device 600 may include a memory array 610, a bit line decoder 620, and a word line decoder 630. The memory array 610 includes memory cells 500, word lines WL, and bit lines BL, BLB.

The word lines WL (i.e., WL0, . . . , WLn−1, WLn) are respectively coupled to a row of the memory cells 500. The bit lines BL, BLB are respectively coupled to a column of the memory cells 500. A sense amplifier (not shown) is coupled to the bit line decoder 620 through data lines DL, DLB (not shown). Details of the memory cells 500 may be referred to the description in connection with FIG. 5, while the details are not redundantly described seriatim herein.

In one embodiment, the bit line decoder 620 may be configured to select voltage signals from the bit lines BL, BLB according to a first address signal (e.g., column selection signal) and to output decoded voltage signals. The word line decoder 630 may be configured to select the word lines WL according to a second address signal (e.g., row selection signal). The voltage signals of the bit lines BL, BLB are transmitted to the bit line decoder 620 and then the voltage signals of the bit lines BL, BLB are decoded to be data signals DS.

In this manner, since each of the memory cell 500 includes a computing circuit 520, the compute-in-memory device 600 may be configured to perform calculations at memory cell level, rather than moving large quantities of data between the main RAM and data stored for each computation step. That is, the compute-in-memory device 600 allows data to be analyzed in real time, enabling faster reporting and decision-making in business and machine learning applications.

Figure 7A:
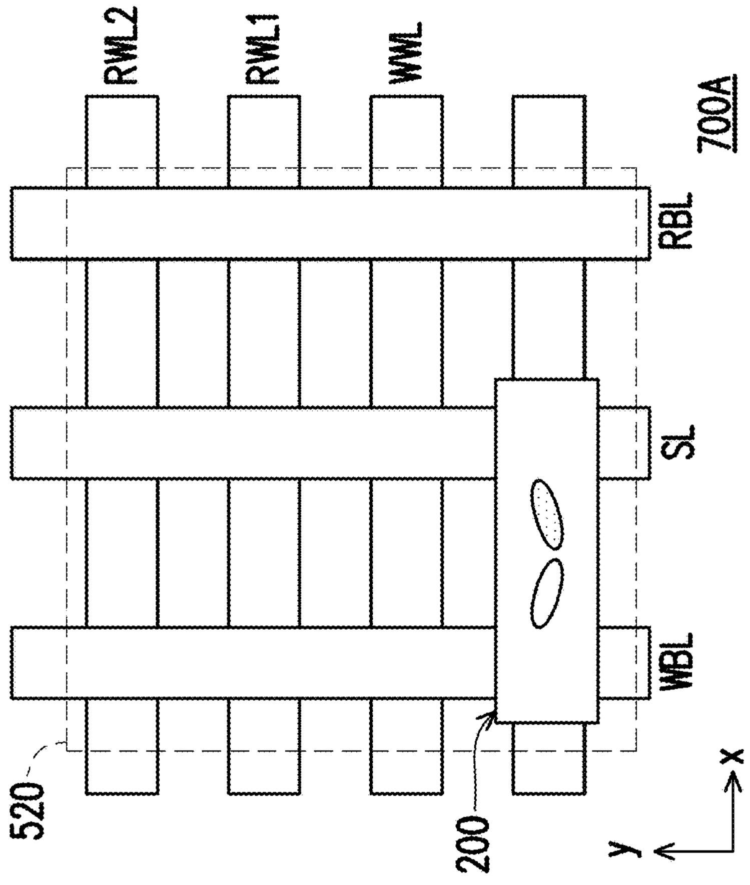
FIG. 7A and FIG. 7B are schematic layouts of a computing circuit according to a first embodiment and a second embodiment of the disclosure.
Figure 7B:
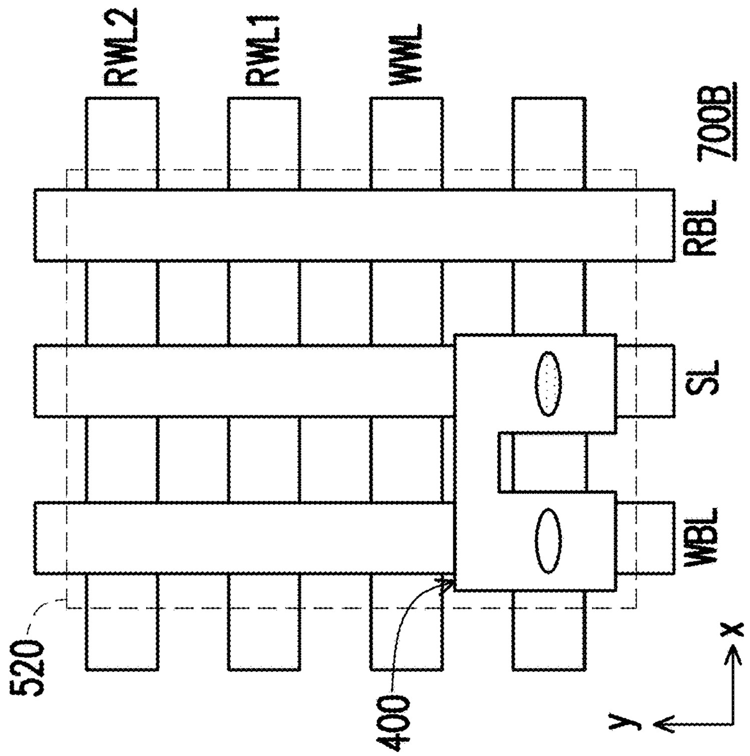

FIG. 7A and FIG. 7B are schematic layouts of a computing circuit according to a first embodiment and a second embodiment of the disclosure. A layout 700A and a layout 700B shows how the computing circuit 520 is integrated into the memory array according to the first embodiment and the second embodiment respectively. FIG. 7A and FIG. 7B have been simplified for the sake of clarity to better understand the inventive concepts of the present disclosure. Additional features of the computing circuit 520 may be seen with reference to the computing circuit 200 shown in FIG. 2B and FIG. 2C and the computing circuit 400 shown in FIG. 4, while the details are not redundantly described seriatim herein.

Reference is first made to layout 700A. The layout 700A include the computing circuit 520, the write bit line WBL, the source line SL, the read bit line RBL, the write word line WWL, the first read word line RWL1, and the second read word line RWL2. The computing circuit 520 may include the computing circuit 200 and the computing circuit 200 is electrically coupled to the write bit line WBL, the source line SL, the read bit line RBL, the write word line WWL, the first read word line RWL1, and the second read word line RWL2.

It is worth mentioned that, since only one current is utilized to simultaneously change the states of the first MTJ MTJ1 and the second MTJ MTJ2 in the computing circuit 200, only one source line SL is needed. Further, only one read bit line is required to read the computing result. That is, in the X direction, smaller width may be utilized to accommodate the computing circuit 200. Furthermore, by placing the first MTJ MTJ1 and the second MTJ MTJ2 in a direction between the X direction and the Y direction, a width of the SOT line SOTL may be smaller. That is, in the Y direction, the word lines WL for the computing circuit 200 may be placed closer with smaller spacing. Therefore, a low-power, small-footprint approach for computations (e.g., XOR/XNOR computation) utilizing SOT-MRAM technology may be achieved.

Reference is first made to layout 700B. The layout 700B has similar structure as the layout 700A. Different from the layout 700A, the layout 700B, the computing circuit 520 may include the computing circuit 400 and the computing circuit 400 is electrically coupled to the write bit line WBL, the source line SL, the read bit line RBL, the write word line WWL, the first read word line RWL1, and the second read word line RWL2.

It is worth mentioned that, since only one current is utilized to simultaneously change the states of the first MTJ MTJ1 and the second MTJ MTJ2 in the computing circuit 200, only one source line SL is needed. Further, only one read bit line is required to read the computing result. That is, in the X direction, smaller width may be utilized to accommodate the computing circuit 200. Therefore, a low-power, small-footprint approach for computations (e.g., XOR/XNOR computation) utilizing SOT-MRAM technology may be achieved.

In summary, according to the computing circuit 200, the computing circuit 400, the memory cell 500, and the compute-in-memory device 600, opposite magnetics polarities may be realized through a shared switching current and two difference values may be stored in the first MTJ MTJ1 or the second MTJ MTJ2 at the same time. Therefore, it is possible to bring the SOT-MRAM technology into more diverse applications with a smaller footprint and power consumption.

In one aspect of this disclosure, this disclosure provides a computing circuit. The computing circuit includes a first magnetic tunnel junction and a second magnetic tunnel junction. The first magnetic tunnel junction is configured to store a first logic value based on a write current. The second magnetic tunnel junction is configured to store a second logic value based on the write current. The first logic value is different from the second logic value.

In a related embodiment, the first magnetic tunnel junction and the second magnetic tunnel junction are respectively belong to a spin-orbit torque magnetic random-access memory cell.

In a related embodiment, the second magnetic tunnel junction is disposed as a mirror image of the first magnetic tunnel junction across a mirror axis.

In a related embodiment, a first magnetic polarity of the first magnetic tunnel junction caused by the write current is different from a second magnetic polarity of the second magnetic tunnel junction caused by the write current.

In a related embodiment, a first disposing angle of the first magnetic tunnel junction is different from a second disposing angle of the second magnetic tunnel junction.

In a related embodiment, a first current direction of the write current flowing in a spin-orbit torque line of the first magnetic tunnel junction is different from a second current direction of the write current flowing in a spin-orbit torque line of the second magnetic tunnel junction.

In a related embodiment, the computing circuit is configured to perform a XOR calculation or a XNOR calculation of a first input signal and a second input signal.

In a related embodiment, the first input signal is configured to represent a direction of the write current, and the second input signal is configured to represent a gate voltage of a read transistor.

In a related embodiment, each of the first magnetic tunnel junction the second magnetic tunnel junction includes: a reference layer, wherein a magnetic polarity of the reference layer is fixed based on the write current; and a free layer, wherein a magnetic polarity of the free layer changes based on the write current.

In a related embodiment, the first logic value is represented by a magnetic polarity of the reference layer being parallel to a magnetic polarity of the free layer; and the second logic value is represented by the magnetic polarity of the reference layer being antiparallel to the magnetic polarity of the free layer.

In another aspect of this disclosure, this disclosure provides a memory cell. The memory cell includes a storage circuit and a computing circuit. The storage circuit is configured to store data. The computing circuit is configured to perform a calculation based on the data. The computing circuit includes a first magnetic tunnel junction and a second magnetic tunnel junction. The first magnetic tunnel junction is configured to store a first logic value based on a write current. The second magnetic tunnel junction is configured to store a second logic value based on the write current. The first logic value is different from the second logic value.

In a related embodiment, the first magnetic tunnel junction and the second magnetic tunnel junction are respectively belong to a spin-orbit torque magnetic random-access memory cell.

In a related embodiment, the second magnetic tunnel junction is disposed as a mirror image of the first magnetic tunnel junction across a mirror axis.

In a related embodiment, a first magnetic polarity of the first magnetic tunnel junction caused by the write current is different from a second magnetic polarity of the second magnetic tunnel junction caused by the write current.

In a related embodiment, a first disposing angle of the first magnetic tunnel junction is different from a second disposing angle of the second magnetic tunnel junction.

In a related embodiment, a first current direction of the write current flowing in a spin-orbit torque line of the first magnetic tunnel junction is different from a second current direction of the write current flowing in a spin-orbit torque line of the second magnetic tunnel junction.

In a related embodiment, the computing circuit is configured to perform a XOR calculation or a XNOR calculation of the a first input signal and a second input signal.

In a related embodiment, the first input signal is configured to represent a direction of the write current, and the second input signal is configured to represent a gate voltage of a read transistor.

In a related embodiment, each of the first magnetic tunnel junction the second magnetic tunnel junction includes: a reference layer, wherein a magnetic polarity of the reference layer is fixed based on the write current; and a free layer, wherein a magnetic polarity of the free layer changes based on the write current.

In yet another aspect of this disclosure, this disclosure provides a compute-in-memory device. The compute-in-memory device includes a memory array, a bit line decoder, and a word line decoder. The memory array includes a plurality of memory cells, a plurality of word lines, and a plurality of bit lines. Each of the plurality of memory cells includes a storage circuit and a computing circuit. The storage circuit is configured to store data. The computing circuit is configured to perform a calculation based on the data. The computing circuit includes a first magnetic tunnel junction and a second magnetic tunnel junction. The first magnetic tunnel junction is configured to store a first logic value based on a write current. The second magnetic tunnel junction is configured to store a second logic value based on the write current. The first logic value is different from the second logic value. The plurality of word lines are respectively coupled to a row of the plurality of memory cells. The plurality of bit lines are respectively coupled to a column of the plurality of memory cells. The bit line decoder is configured to select voltage signals from the plurality of bit lines according to a first address signal. The word line decoder is configured to select the plurality of word lines according to a second address signal.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A computing circuit, comprising:
a first magnetic tunnel junction, configured to store a first logic value based on a write current; and
a second magnetic tunnel junction, configured to store a second logic value based on the write current,
wherein the first logic value is different from the second logic value,
the first magnetic tunnel junction and the second magnetic tunnel junction are arranged in parallel,
the computing circuit is configured to perform a XOR calculation or a XNOR calculation of a first input signal and a second input signal,
the first input signal is configured to represent a direction of the write current, and
the second input signal is configured to represent a gate voltage of a read transistor.

2. The computing circuit according to claim 1, wherein each of the first magnetic tunnel junction and the second magnetic tunnel junction is a spin-orbit torque magnetic random-access memory cell.

3. The computing circuit according to claim 1, wherein the second magnetic tunnel junction is disposed as a mirror image of the first magnetic tunnel junction across a mirror axis.

4. The computing circuit according to claim 1, wherein a first magnetic polarity of the first magnetic tunnel junction caused by the write current is different from a second magnetic polarity of the second magnetic tunnel junction caused by the write current.

5. The computing circuit according to claim 1, wherein a first disposing angle of the first magnetic tunnel junction is different from a second disposing angle of the second magnetic tunnel junction.

6. The computing circuit according to claim 1, wherein a first current direction of the write current flowing in a spin-orbit torque line of the first magnetic tunnel junction is different from a second current direction of the write current flowing in a spin-orbit torque line of the second magnetic tunnel junction.

7. The computing circuit according to claim 1, wherein each of the first magnetic tunnel junction and the second magnetic tunnel junction comprises:

a reference layer, wherein a magnetic polarity of the reference layer is fixed based on the write current; and a free layer, wherein a magnetic polarity of the free layer changes based on the write current.

8. The computing circuit according to claim 7, wherein the first logic value is represented by a magnetic polarity of the reference layer being parallel to a magnetic polarity of the free layer; and the second logic value is represented by the magnetic polarity of the reference layer being antiparallel to the magnetic polarity of the free layer.

9. A memory cell, comprising:

a storage circuit, configured to store data; and a computing circuit, configured to perform a calculation based on the data and comprising:

a first magnetic tunnel junction, configured to store a first logic value based on a write current; and a second magnetic tunnel junction, configured to store a second logic value based on the write current, wherein the first logic value is different from the second logic value, the first magnetic tunnel junction and the second magnetic tunnel junction are arranged in parallel, the computing circuit is configured to perform a XOR calculation or a XNOR calculation of a first input signal and a second input signal, the first input signal is configured to represent a direction of the write current, and the second input signal is configured to represent a gate voltage of a read transistor.

10. The memory cell according to claim 9, wherein each of the first magnetic tunnel junction and the second magnetic tunnel junction is a spin-orbit torque magnetic random-access memory cell.

11. The memory cell according to claim 9, wherein the second magnetic tunnel junction is disposed as a mirror image of the first magnetic tunnel junction across a mirror axis.

12. The memory cell according to claim 9, wherein a first magnetic polarity of the first magnetic tunnel junction caused by the write current is different from a second magnetic polarity of the second magnetic tunnel junction caused by the write current.

13. The memory cell according to claim 9, wherein a first disposing angle of the first magnetic tunnel junction is different from a second disposing angle of the second magnetic tunnel junction.

14. The memory cell according to claim 9, wherein a first current direction of the write current flowing in a spin-orbit torque line of the first magnetic tunnel junction is different from a second current direction of the write current flowing in a spin-orbit torque line of the second magnetic tunnel junction.

15. A compute-in-memory device, comprising:

a memory array, comprising:

a plurality of memory cells, wherein each of the memory cell comprises:

a storage circuit, configured to store data; and computing circuit, configured to perform a calculation based on the data and comprising:

a first magnetic tunnel junction, configured to store a first logic value based on a write current; and a second magnetic tunnel junction, configured to store a second logic value based on the write current, wherein the first logic value is different from the second logic value and the first magnetic tunnel junction and the second magnetic tunnel junction are arranged in parallel;

a plurality of word lines, respectively coupled to a row of the plurality of memory cells; and a plurality of bit lines, respectively coupled to a column of the plurality of memory cells;

a bit line decoder, configured to select voltage signals from the plurality of bit lines according to a first address signal; and a word line decoder, configured to select the plurality of word lines according to a second address signal, the computing circuit is configured to perform a XOR calculation or a XNOR calculation of a first input signal and a second input signal, the first input signal is configured to represent a direction of the write current, and the second input signal is configured to represent a gate voltage of a read transistor.

16. The compute-in-memory device according to claim 15, wherein each of the first magnetic tunnel junction and the second magnetic tunnel junction is a spin-orbit torque magnetic random-access memory cell.

17. The compute-in-memory device according to claim 15, wherein the second magnetic tunnel junction is disposed as a mirror image of the first magnetic tunnel junction across a mirror axis.

18. The compute-in-memory device according to claim 15, wherein a first magnetic polarity of the first magnetic tunnel junction caused by the write current is different from a second magnetic polarity of the second magnetic tunnel junction caused by the write current.

19. The compute-in-memory device according to claim 15, wherein a first disposing angle of the first magnetic tunnel junction is different from a second disposing angle of the second magnetic tunnel junction.

20. The compute-in-memory device according to claim 15, wherein a first current direction of the write current flowing in a spin-orbit torque line of the first magnetic tunnel junction is different from a second current direction of the write current flowing in a spin-orbit torque line of the second magnetic tunnel junction.

* * * * *